United States Patent
Konishi et al.

(10) Patent No.: US 10,069,585 B1
(45) Date of Patent: Sep. 4, 2018

(54) TRANSMISSION DEVICE, COMMUNICATION DEVICE AND SIGNAL TRANSMISSION SYSTEM

(71) Applicant: Mitsubishi Electric Corporation, Chiyoda-ku (JP)

(72) Inventors: Yoshiaki Konishi, Tokyo (JP); Kazuo Kubo, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 23 days.

(21) Appl. No.: 15/516,530

(22) PCT Filed: Dec. 14, 2015

(86) PCT No.: PCT/JP2015/084977
§ 371 (c)(1),
(2) Date: Apr. 3, 2017

(87) PCT Pub. No.: WO2016/098742
PCT Pub. Date: Jun. 23, 2016

(30) Foreign Application Priority Data

Dec. 15, 2014 (JP) ................................. 2014-253360

(51) Int. Cl.
*H04J 14/02* (2006.01)
*H04J 3/16* (2006.01)
*H04L 25/49* (2006.01)

(52) U.S. Cl.
CPC ........ *H04J 3/1652* (2013.01); *H04L 25/4908* (2013.01); *H04J 2203/0089* (2013.01)

(58) Field of Classification Search
CPC .......... H04B 10/2575; H04B 10/25753; H04B 10/25754; H04B 10/27; H04J 14/02; H04J 14/0227
(Continued)

(56) References Cited

U.S. PATENT DOCUMENTS

2001/0053161 A1    12/2001  Tomizawa et al.
2013/0089111 A1    4/2013   Ookubo
(Continued)

FOREIGN PATENT DOCUMENTS

CN    103947141 A    7/2014
JP    55-52651 A     4/1980
(Continued)

OTHER PUBLICATIONS

"Interfaces for the optical transport network," ITU-T G.709/Y.1331, International Telecommunication Union, Feb. 2012, 237 pages.
(Continued)

*Primary Examiner* — Hanh Phan
(74) *Attorney, Agent, or Firm* — Oblon, McClelland, Maier & Neustadt, L.L.P.

(57) ABSTRACT

A transmission device of a signal transmission system multiplexing and transmitting a plurality of 8B10B-coded information sequences, which includes: conversion units the number of which is identical to the number of the information sequences, to perform 8B10B-decoding of each of the information sequences, receive one of the information sequences after the decoding, scramble the received information sequence, and add a synchronous pattern indicating a head of a frame to the scrambled information sequence; and a multiplexing unit to multiplex the information sequence outputted from each of the conversion units.

11 Claims, 9 Drawing Sheets

(58) Field of Classification Search
USPC ..... 398/79, 66, 115, 116, 43, 158, 159, 154, 398/155, 182, 183, 192, 193, 194, 68, 67, 398/72, 100; 370/352, 392, 535, 389, 370/468, 476
See application file for complete search history.

(56) References Cited

U.S. PATENT DOCUMENTS

| | | | |
|---|---|---|---|
| 2013/0170579 A1 | 7/2013 | Nishioka | |
| 2014/0355991 A1* | 12/2014 | Cameirao | H04B 10/2575 398/79 |
| 2015/0229397 A1* | 8/2015 | Shibata | H04B 10/25754 398/115 |
| 2015/0311980 A1 | 10/2015 | Kuwano et al. | |

FOREIGN PATENT DOCUMENTS

| | | |
|---|---|---|
| JP | 1-256832 A | 10/1989 |
| WO | 2012/049815 A1 | 4/2012 |
| WO | 2014/077168 A1 | 5/2014 |

OTHER PUBLICATIONS

International Search Report and Written Opinion of the International Searching Authority dated Mar. 1, 2016 in PCT/JP2015/084977 filed Dec. 14, 2015.

Combined Office Action and Search Report dated Jan. 4, 2018 in Chinese Patent Application No. 201580066878.8 with unedited computer generated English translation of the Office Action and English translation of categories of cited documents, citing document AO therein 16 pages.

Extended Search Report dated Sep. 4, 2017 in European Patent Application No. 15869947.0.

* cited by examiner

TRANSMISSION DEVICE, COMMUNICATION DEVICE AND SIGNAL TRANSMISSION SYSTEM

FIELD

The present invention relates to a transmission device, a communication device and a signal transmission system, that multiplex and transmit a plurality of information sequences.

BACKGROUND

For efficient operation of a macrocell base station in a mobile communication system, introduction of a mobile fronthaul in which an antenna part and a baseband signal processing part are separated has been in progress. A common public radio interface (CPRI) is a de facto standard of a wired signal that connects a device corresponding to the antenna part and a device corresponding to the baseband signal processing part. Along with a traffic increase in a wireless terminal such as a smartphone, an increase in capacity of an optical transmission link that connects an antenna device and a baseband signal processing device is also demanded. Additionally, a method for efficiently multiplexing and transferring a CPRI signal, which is transmitted and received in the optical transmission link between the devices, while holding some signal quality such as a delay or error rate is also demanded.

In an optical transport network (OTN) that is a transmission standard in optical communication, it is possible to admit various kinds of client signals and to improve transmission quality of a signal by providing a parity for error correction.

In the OTN standard, a number of multiplexing methods are prescribed to efficiently and economically transfer various kinds of many client signals including CPRI. For example, in Non-Patent Literature 1, there is described a set value or the like in a case where signals such as CPRI option 3 of 2.458 Gbit/s and CPRI option 4 of 3.072 Gbit/s are contained in an optical channel transport unit (OTU) frame using a generic mapping procedure (GMP).

CITATION LIST

Non Patent Literature

Non Patent Literature 1: ITU-T G.709/Y.1331 "Interfaces for the optical transport network"

SUMMARY

Technical Problem

In a CPRI signal, an 8B10B code is used as a transmission line code. In a system having a configuration of containing and transmitting a CPRI signal in an OTU frame, a method of compressing a band in an OTN section into 4/5 by decoding an 8B10B code and subsequently transmitting it is currently considered for the purpose of improving containing efficiency at the time of CPRI signal multiplexing transfer based on the OTU frame. For example, in a case of multiplexing four "CPRI option 3" signals of 2.4576 Gbit/s each, a band of 9.8304 Gbit/s is necessary for realizing such multiplexing without a decoding process, whereas the band is compressed to 7.8643 Gbit/s when the multiplexing is performed after decoding, thereby making it possible to multiplex more signals and extend a transmission distance.

Here, a CPRI signal is composed of a hyper frame with a length of 66.67 microseconds, and uses a K28.5 code of an 8B10B code for a synchronous byte of a frame head thereof. The K28.5 code is one and only code, in which a unique 10-bit sequence called a comma pattern appears in the 8B10B code. Usually, a frame head is identified on a reception side for the CPRI signal by detecting this K28.5 code in a data string four times consecutively.

However, in a case where an 8B10B code is multiplexed after decoding and is transferred in an OTU frame, a K28.5 code is decoded from a comma pattern to eight bits that cannot be distinguished from the other data in the decoding process, and head information of a CPRI signal is lost. Therefore, multiplexing is performed in a transmission side in such a manner that a frame head of each decoded CPRI signal is aligned with a head position of an OTU frame and thereby a head of a CPRI frame can be identified on a reception side.

However, a waiting time for 66.67 microseconds is necessary at the worst to align heads of CPRI signals when multiplexing the CPRI signals. For this reason, in such a multiplexing method, there is a problem that low-delay transfer in a microsecond order demanded by a transmission device applied to the mobile fronthaul cannot be realized.

The present invention is provided in view of the above circumstances, and its object is to provide a transmission device that can prevent an increase in a necessary band and a transmission delay time when multiplexing and transmitting an 8B10B-coded signal.

Solution to Problem

In order to solve the above-mentioned problems and achieve the object, the present invention provides a transmission device multiplexing and transmitting a plurality of coded information sequences, comprising: conversion units the number of which is identical to the number of the information sequences, to decode each of the information sequences, receive one of the information sequences after the decoding, scramble the received information sequence, and add a synchronous pattern indicating a head of a frame to the scrambled information sequence to perform output thereof; and a multiplexing unit to multiplex the information sequence outputted from each of the conversion units.

Advantageous Effects of Invention

According to the present invention, an advantageous effect is yielded in that it is possible to prevent an increase in a necessary band and a transmission delay time when multiplexing and transmitting a plurality of 8B10B-coded information sequences.

DESCRIPTION OF EMBODIMENTS

In the following, a transmission device, a communication device and a signal transmission system according to embodiments of the present invention will be described in detail with reference to the drawings. Note that this invention is not limited to these embodiments.

First Embodiment

Figure 1:
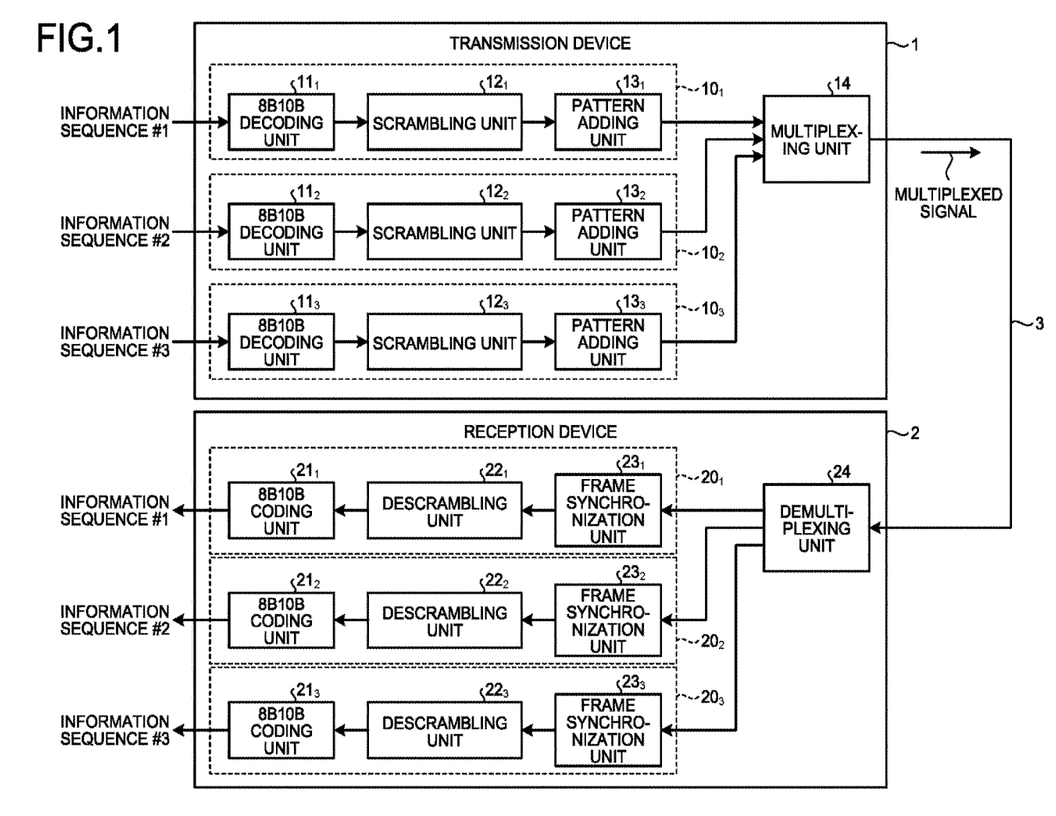
FIG. 1 is a diagram illustrating a configuration example of a signal transmission system according to a first embodiment of the present invention.

FIG. 1 is a diagram illustrating a configuration example of a signal transmission system according to the first embodiment of the present invention. The signal transmission system illustrated in FIG. 1 multiplexes and transmits an 8B10B-coded information sequence. For example, this signal transmission system transmits a common public radio interface (CPRI) signal between an antenna device and a baseband signal processing device in a mobile fronthaul of a mobile communication system.

As illustrated in FIG. 1, the signal transmission system according to the present embodiment is configured to include a transmission device 1 that receives a plurality of information sequences #1, #2 and #3, and multiplexes the information sequences to transmit the sequences to an optical transmission line 3, and a reception device 2 that receives, from the optical transmission line 3, a signal transmitted from the transmission device 1, and reproduces the information sequences #1, #2 and #3 before the multiplexing from the multiplexed information sequence to output the reproduced result. The optical transmission line 3 is an optical fiber. The information sequences #1, #2 and #3 are 8B10B-coded, and become CPRI signals in a case where the signal transmission system is applied to a mobile fronthaul of a mobile communication system. Also, in this case, the information sequences #1, #2 and #3 are transmitted and received between a device that performs baseband signal processing and an antenna device, which are not illustrated. That is, the information sequences #1, #2 and #3 are inputted from the baseband signal processing device to the transmission device 1, and outputted from the reception device 2 to the antenna device. Alternatively, these information sequences are inputted from the antenna device to the transmission device 1, and outputted from the reception device 2 to the baseband signal processing device. Note that in FIG. 1, three information sequences are multiplexed into a signal. However, this is one example, and the number of information sequences to be multiplexed is not limited to three. In the following description, description will be made on the assumption that the information sequences #1, #2 and #3 are CPRI signals.

The transmission device 1 includes a conversion unit $10_n$ that converts an information sequence #n (n=1, 2, 3) and generates an information sequence with a small amount of information, and a multiplexing unit 14 that receives the information sequence after the conversion in each conversion unit $10_n$ and multiplexes it, and transmit the result thereof as a multiplexed signal to the reception device 2 through the optical transmission line 3.

Each conversion unit $10_n$ includes an 8B10B decoding unit $11_n$ that decodes an information sequence #n, a scrambling unit $12_n$ that receives and scrambles the information sequence obtained after the decoding by the 8B10B decoding unit $11_n$, and a pattern adding unit $13_n$ that adds a synchronous pattern, which is a fixed bit pattern indicating a head of a frame, to the information sequence scrambled in the scrambling unit $12_n$.

The reception device 2 includes an inverse conversion unit $20_n$ that reproduces an information sequence #n before the conversion of the conversion unit $10_n$ of the transmission device 1 by executing frame synchronization processing (described later) and inverse processing to the processing executed by the 8B10B decoding unit $11_n$ and the scrambling unit $12_n$ of the transmission device 1, with respect to an input information sequence, and a demultiplexing unit 24 that receives the multiplexed signal transmitted from the multiplexing unit 14 of the transmission device 1 and reproduces an information sequence before the multiplexing of the multiplexing unit 14.

Each inverse conversion unit $20_n$ includes an 8B10B coding unit $21_n$ that performs 8B10B-coding of an input information sequence, a descrambling unit $22_n$ that executes inverse processing to the processing having been executed by the scrambling unit $12_n$ of the transmission device 1, with respect to an input information sequence, and a frame synchronization unit $23_n$ that executes the frame synchronization processing on the basis of the synchronous pattern added to an input information sequence.

Figure 2:
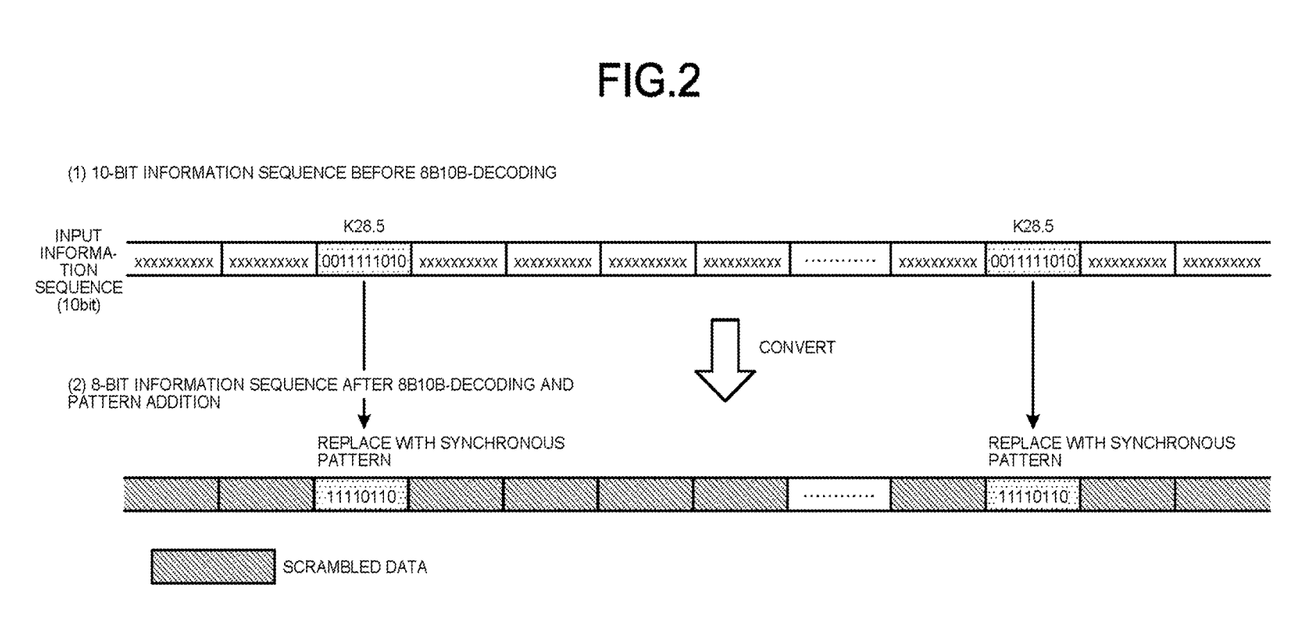
FIG. 2 is a chart illustrating an example of processing executed with respect to an information sequence by a conversion unit of the first embodiment.

Next, an operation of the transmission device 1 will be described in detail. First, with reference to FIG. 2, an operation of the conversion unit $10_n$ of the transmission device 1 will be described. FIG. 2 is a chart illustrating an example of processing executed with respect to an input information sequence #n by the conversion unit $10_n$ of the transmission device 1.

An 8B10B-coded information sequence #n such as a CPRI frame, input to the conversion unit $10_n$, has a fixed frame length. As illustrated in FIG. 2(1), a 10-bit K28.5 code indicating a frame head, that is, a synchronous pattern is inserted at regular intervals. The 8B10B decoding unit $11_n$ decodes an 8B10B-coded information sequence #n that is an input signal, and converts a 10-bit information sequence into an 8-bit information sequence. The scrambling unit $12_n$ scrambles an information sequence that is, of the information sequence #n having been obtained by the decoding of the 8B10B decoding unit $11_n$, an information sequence except for eight bits corresponding to an insertion position of each K28.5 code, that is, an information sequence from which each of the 8-bit code acquired by execution of the decoding processing on each of the K28.5 codes is excluded. As a scrambling method, for example, a method of calculating exclusive OR of an information sequence to be scrambled and a pseudo-random pattern is used. Other scrambling methods may be used. The pattern adding unit $13_n$ inserts, as a synchronous pattern, specific eight bits that are a fixed bit sequence such as "11110110" illustrated in FIG. 2(2), for example, at a predetermined position in the information sequence #n scrambled in the scrambling unit $12_n$, more specifically, at a position corresponding to an insertion position of each K28.5 code.

Figure 3:
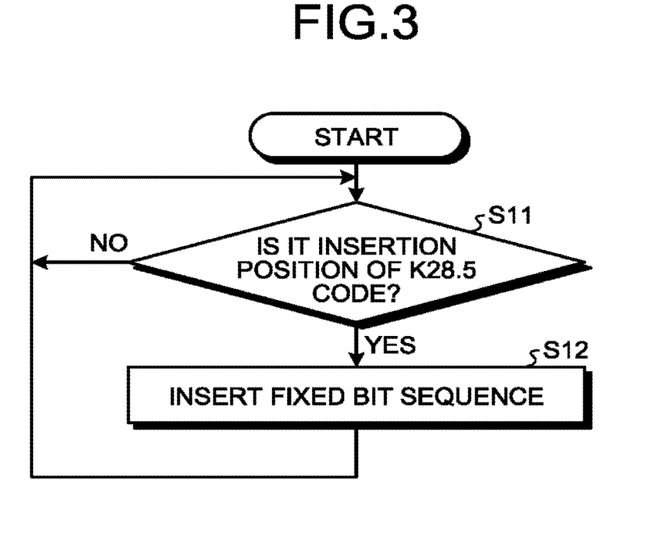
FIG. 3 is a flowchart illustrating an operation example of a pattern adding unit.

FIG. 3 is a flowchart illustrating an operation example of the pattern adding unit $13_n$. When an information sequence #n is inputted from the 8B10B decoding unit $11_n$, the pattern adding unit $13_n$ checks whether it is an insertion position of a K28.5 code appears or not (step S11). In a case where an insertion position of the K28.5 code does not appear (step S11: No), the pattern adding unit $13_n$ keeps performing the processing of step S11. On the other hand, in a case where an insertion position of the K28.5 code is detected (step S11: Yes), the pattern adding unit $13_n$ inserts an 8-bit fixed bit sequence in the detected insertion position (step S12). After executing of step S12, the pattern adding unit $13_n$ returns to step S11 and continues the process.

Note that as the synchronous pattern inserted by the pattern adding unit $13_n$, "BC" that is a hexadecimal number that is a result obtained by 8B10B decoding of "0011111010" that is the K28.5 code may be used. That is, "10111100" may be used as a synchronous pattern. Also, it is possible to have a multi-frame configuration of changing a value of a synchronous pattern in constant periods based on a CPRI frame length.

Figure 4:
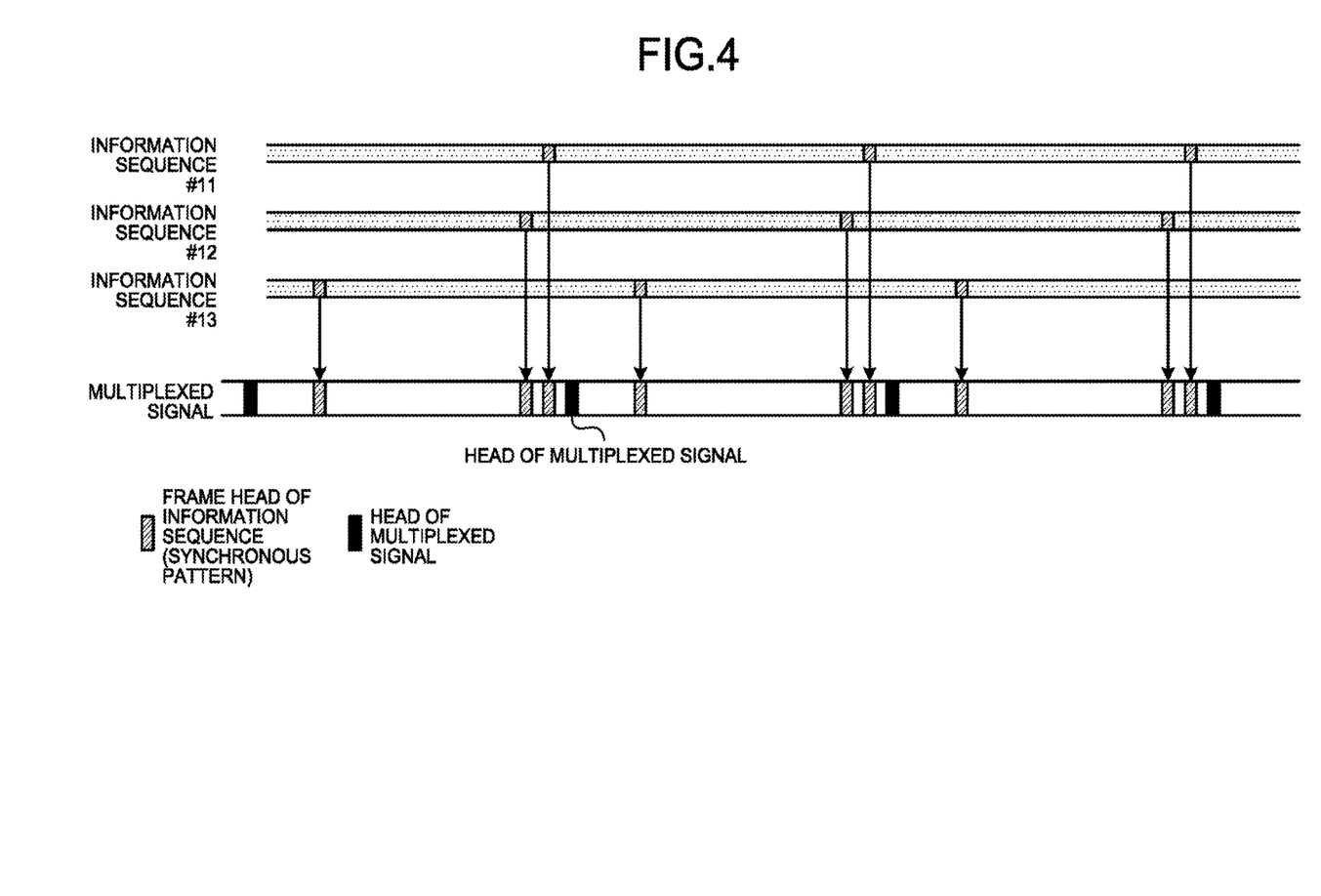
FIG. 4 is a chart illustrating an example of processing in which a multiplexing unit of the first embodiment generates a multiplexed signal.

Next, an operation of the multiplexing unit 14 of the transmission device 1 will be described with reference to FIG. 4. FIG. 4 is a chart illustrating an example of processing in which the multiplexing unit 14 generates a multiplexed signal by multiplexing information sequences #11, #12 and #13 outputted from the pattern adding units $13_1$, $13_2$ and $13_3$.

Each time the information sequences #11, #12 and #13 are inputted from the pattern adding unit $13_1$, $13_2$ and $13_3$, the multiplexing unit 14 sequentially stores these sequences in a data storage region that is a payload of an OTU frame. That is, the multiplexing unit 14 immediately stores the input information sequences #11, #12 and #13 in the data storage region of the OTU frame without providing a delay to the sequences. Here, frame heads of the information sequences, that is, heads of frames of the information sequences stored in the OTU frame do not have to be aligned with each other. This is because a side of the reception device 2 can detect a head of a frame on the basis of a synchronous pattern included in a reception signal.

Figure 5:
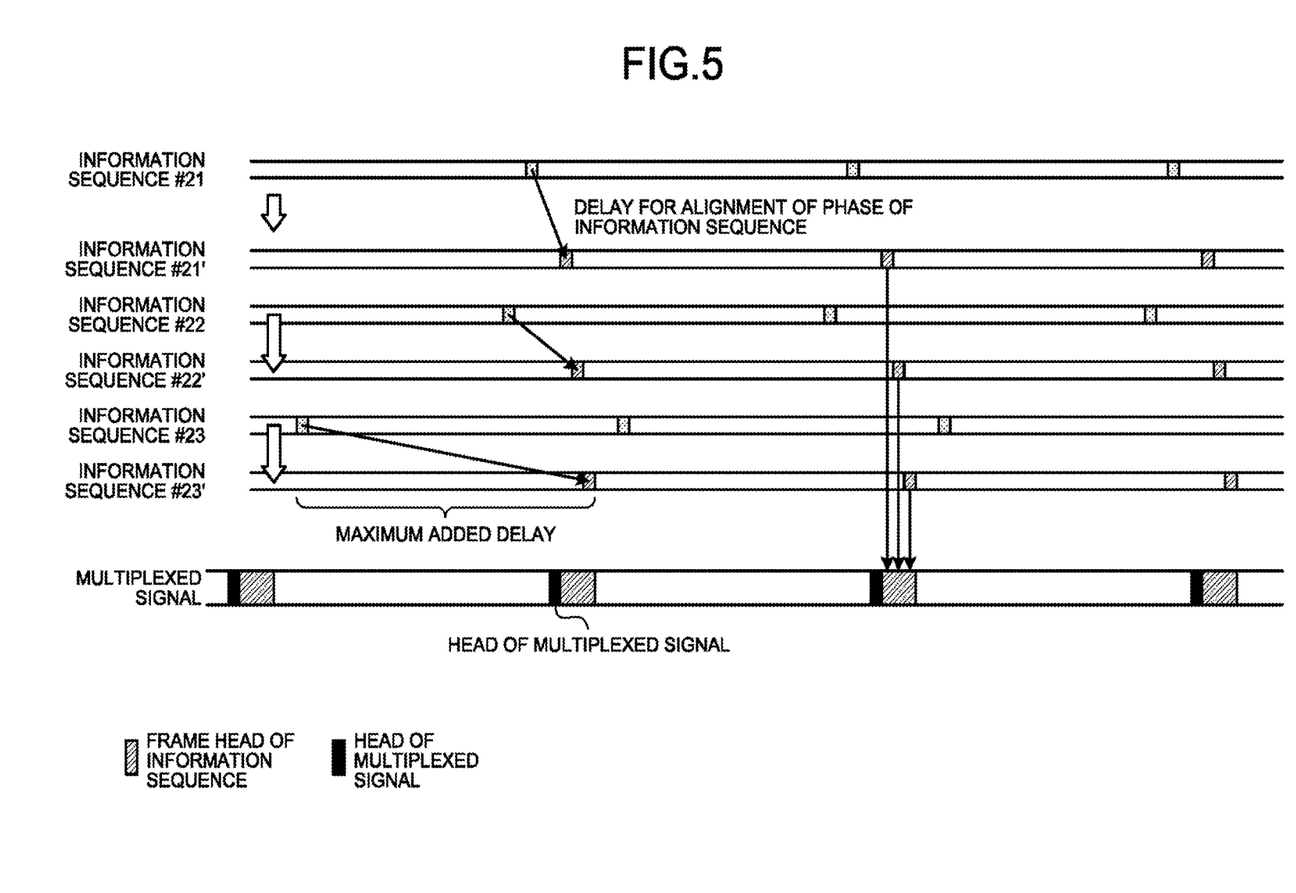
FIG. 5 is a chart illustrating a method of performing multiplexing without application of the present invention.

Note that in a case where the present invention is not applied, that is, in a case where a CPRI signal after the 8B10B decoding is stored in an OTU frame and multiplexed without insertion of the above-described synchronous pattern, it is necessary to give a delay in storing the CPRI signal in the OTU frame as needed. FIG. 5 is a chart illustrating a method of performing multiplexing of a CPRI signal without application of the present invention. As illustrated in FIG. 5, heads of frames of information sequences #21, #22 and #23 that are CPRI signals having been subjected to 8B10B-decoding are not necessarily inputted in an aligned manner to a block for performing multiplexing processing, and a time difference for a frame length is generated at maximum at a timing of inputting the frame. For this reason, it is necessary to align phases of the information sequences by giving a delay to each of the information sequences #21, #22 and #23 and making information sequences #21', #22' and #23', and then to store the CPRI signal in an OTU frame. For example, in a case where an information sequence is a CPRI signal, a waiting time for 66.67 microseconds is generated at maximum for alignment with a head of an OTU frame. If the present invention is not applied, information indicating a head of a frame is not included in each information sequence to be multiplexed, so that it is necessary to perform the storing with a head of a frame of each information sequence being aligned with a head of an OTU frame thereby to make it possible for a reception side to detect the head of the frame.

Next, an operation of the reception device 2 will be described in detail. First, in the reception device 2, the demultiplexing unit 24 extracts information sequences #11, #12 and #13 from an OTU frame that is a received multiplexed signal, and transfers an information sequence #1n (n=1, 2, 3) to the frame synchronization unit $23_n$ of the inverse conversion unit $20_n$. Then, the frame synchronization unit $23_n$ detects a frame head by continuously detecting a synchronous pattern assigned in the pattern adding unit $13_n$ of the transmission device 1. In a case where the information sequence is a CPRI signal, a frame head is detected by detecting the synchronous pattern continuously four times. Here, since the information sequence #1n is scrambled in the scrambling unit $12_n$ of the transmission device 1, the information sequence #1n is in a state in which a probability that the same pattern as a synchronous pattern appears in a position other than a frame head is extremely suppressed. Thus, the frame synchronization unit $23_n$ can recognize a frame head of the information sequence #1n. Then, the descrambling unit $22_n$ descrambles the information sequence #1n on the basis of the frame head detected in the frame synchronization unit $23_n$. That is, descrambling is performed with respect to a part other than the synchronous pattern as an object to be descrambled, and reproduction is performed to obtain an information sequence before the scrambling of the scrambling unit $12_n$ of the transmission device 1.

Figure 6:
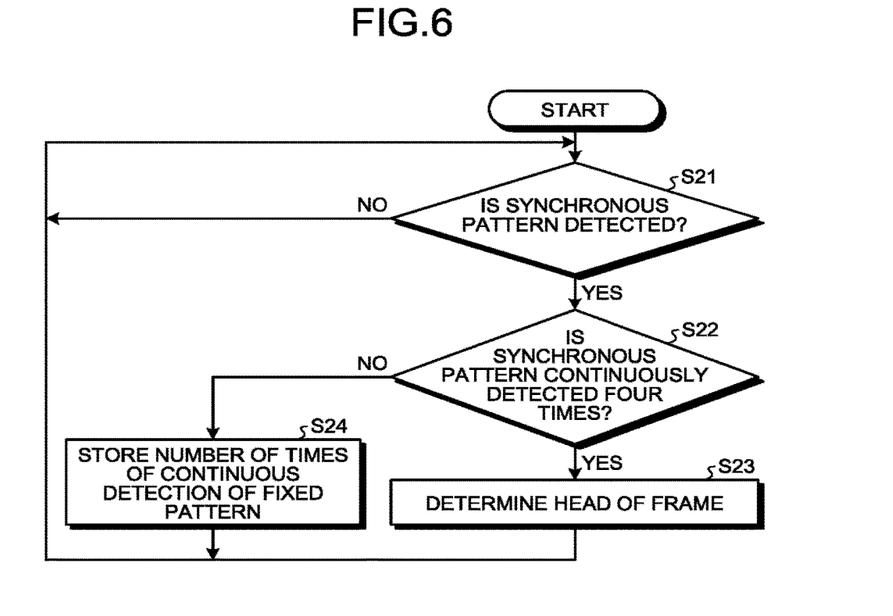
FIG. 6 is a flowchart illustrating an operation example of a frame synchronization unit.

FIG. 6 is a flowchart illustrating an operation example of the frame synchronization unit $23_n$. When an information sequence #n is inputted from the demultiplexing unit 24, the frame synchronization unit $23_n$ checks whether there is a correspondence with an 8-bit fixed bit sequence indicating a synchronous pattern (step S21). In a case where there is no correspondence with the synchronous pattern (step S21: No), the frame synchronization unit $23_n$ keeps performing the processing of step S21. On the other hand, in a case where there is a correspondence with the synchronous pattern (step S21: Yes), the frame synchronization unit $23_n$ checks whether the synchronous pattern is detected continuously four times, that is, the number of times of continuous detection of the synchronous pattern becomes four (step S22). In a case where a number acquired by addition of one to the stored number of times of continuous detection becomes four, that is, in a case where a synchronous pattern is detected in a state in which the stored number of times of continuous detection is three, the frame synchronization unit $23_n$ determines that the number of times of continuous detection of the synchronous pattern becomes four. When the number of times of continuous detection is not four (step S22: No), the frame synchronization unit $23_n$ stores the number of times of continuous detection (step S24), and returns to step S21 to continue the process. When the number of times of continuous detection is four (step S22: Yes), the frame synchronization unit 23, determines a head of the frame (step S23).

After executing step S23, the frame synchronization unit $23_n$ returns to step S21 to continue the process. Note that in a case where a detection interval of a synchronous pattern is a previously-assumed time interval, the frame synchronization unit $23_n$ determines that the synchronous pattern is continuously detected. Here, the "previously-assumed time interval" is an interval in which the pattern adding unit $13_n$ of the transmission device 1 inserts a synchronous pattern.

Also, in a case where continuous detection of a synchronous pattern is interrupted, that is, in a case where a synchronous pattern is not detected for a period of time longer than the "previously-assumed time interval" after detection of the synchronous pattern, in other words, for a period of time acquired by addition of a margin to the "previously-assumed time interval," the frame synchronization unit $23_n$ updates the stored number of times of continuous detection to zero. For example, the frame synchronization unit $23_n$ uses a timer that starts at detection of a synchronous pattern and counts a period of time acquired by addition of a certain period of time (corresponding to the above margin) to a period of time corresponding to the "previously-assumed time interval," that is, a timer that starts a count operation when determining "Yes" in step S21 and expires when a certain period of time elapses after the period of time corresponding to the "previously-assumed time interval" elapses, and update the stored number of times of continuous detection to zero when this timer expires. It is assumed that the "certain period of time" is shorter than the "previously-assumed time interval." When a synchronous pattern is detected before the expiry of this timer, the frame synchronization unit $23_n$ restarts the timer.

Note that in a case where a synchronous pattern inserted by the pattern adding unit $13_n$ of the transmission device 1 is different from "BC" acquired in 8B10B-decoding of a K28.5 code, processing of replacing a synchronous pattern inserted in an information sequence #1n with "BC" is also performed in the frame synchronization unit $23_n$ or the descrambling unit $22_n$.

Finally, the 8B10B coding unit $21_n$ performs 8B10B-coding of the information sequence descrambled in the descrambling unit $22_n$, and reproduces and outputs an original information sequence #n.

As described above, in the signal transmission system of the present embodiment, when decoding, multiplexing and transferring a plurality of 8B10B-coded information sequences, the transmission device 1 scrambles data other than a code word indicating a frame head and replaces the code word indicating the frame head with a synchronous pattern for each information sequence, while the reception device 2 detects the synchronous pattern inserted in each received information sequence and identifies a frame head of each information sequence.

In such a manner, since the transmission device 1 replaces a code indicating a frame head with a synchronous pattern, it becomes unnecessary to perform storing into an OTU frame after aligning heads of frames to be multiplexed so as to make it possible for the reception device 2 to detect the frame head. Therefore, it is possible to prevent an increase in a necessary band and a transmission delay time when multiplexing and transmitting a plurality of 8B10B-coded information sequences.

Note that an example in which an information sequence is 8B10B-coded has been described, but it is possible to realize application of the invention to a case where an information sequence on which different coding is performed is multiplexed and transmitted.

Second Embodiment

Figure 7:
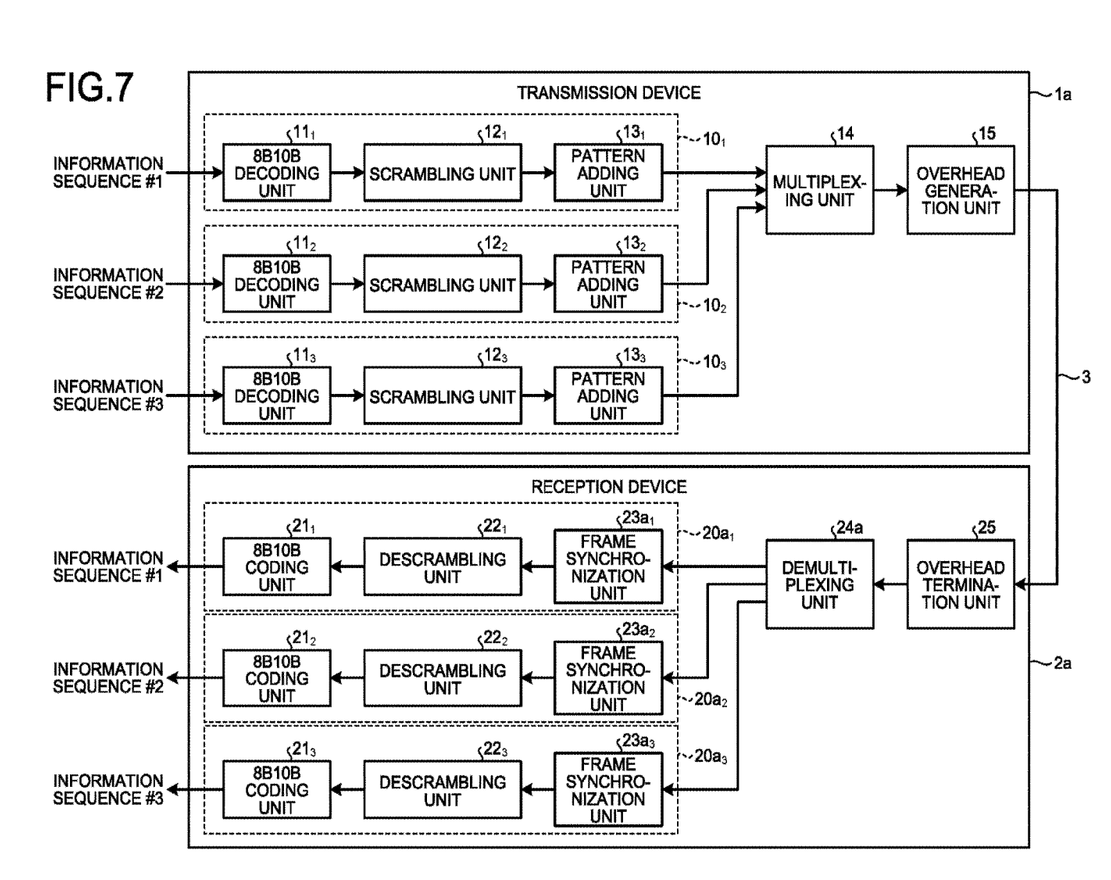
FIG. 7 is a diagram illustrating a configuration example of a signal transmission system according to a second embodiment of the present invention.

FIG. 7 is a diagram illustrating a configuration example of a signal transmission system according to a second embodiment of the present invention. In the signal transmission system according to the present embodiment, the transmission device 1 and the reception device 2 of the signal transmission system according to the first embodiment illustrated in FIG. 1 are replaced with a transmission device 1a and a reception device 2a, respectively. Also, the transmission device 1a is realized by adding an overhead generation unit 15 to the transmission device 1. The reception device 2a is realized by adding an overhead termination unit 25 to the reception device 2, replacing the demultiplexing unit 24 with a demultiplexing unit 24a, and replacing the inverse conversion units $20_1$, $20_2$ and $20_3$ with inverse conversion units $20a_1$, $20a_2$ and $20a_3$. The inverse conversion units $20a_1$, $20a_2$ and 20a3 are realized by replacing the frame synchronization units $23_1$, $23_2$ and $23_3$ of the inverse conversion units $20_1$, $20_2$ and $20_3$ with frame synchronization units $23a_1$, $23a_2$ and $23a_3$. In FIG. 7, the same sign is assigned to a part common with the signal transmission system of the first embodiment illustrated in FIG. 1. Description of the part common with the signal transmission system of the first embodiment will be omitted.

In the transmission device 1a, the overhead generation unit 15 adds an overhead including information of a synchronous pattern to an OTU frame that is a multiplexed frame generated in the multiplexing unit 14. Specifically, the overhead generation unit 15 generates an overhead including the same bit sequence as an 8-bit synchronous pattern inserted in an information sequence multiplexed and transmitted in an OTU frame, adds the overhead to the OTU frame, and transmits it to the reception device 2a through the optical transmission line 3.

Figure 8:
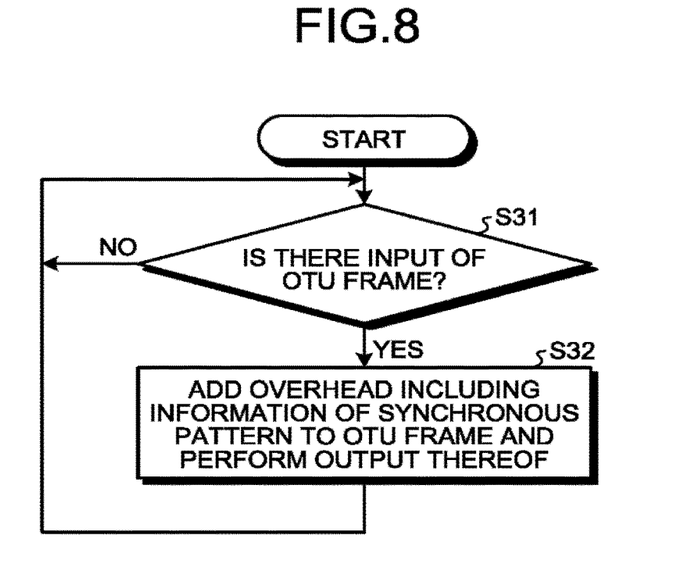
FIG. 8 is a flowchart illustrating an operation example of an overhead generation unit.

FIG. 8 is a flowchart illustrating an operation example of the overhead generation unit 15. The overhead generation unit 15 monitors whether or not an OTU frame is inputted (step S31) and keeps performing a monitoring operation in a case where there is no input (step S31: No). When there is an input of an OTU frame (step S31: Yes), the overhead generation unit 15 adds, to the OTU frame, an overhead including information of a synchronous pattern, that is, information of an 8-bit fixed bit sequence indicating a synchronous pattern, and outputs it (step S32). After executing step S32, the overhead generation unit 15 returns to step S31 and continues the process.

In the reception device 2a, when an OTU frame is received, the overhead termination unit 25 removes an overhead added in the overhead generation unit 15, and transfers the OTU frame to the demultiplexing unit 24a along with information of the synchronous pattern included in the overhead.

Figure 9:
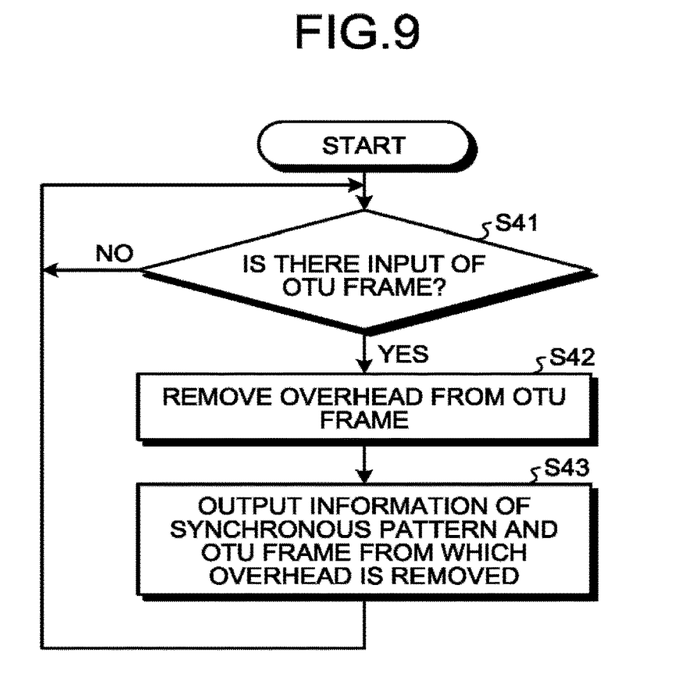
FIG. 9 is a flowchart illustrating an operation example of an overhead termination unit.

FIG. 9 is a flowchart illustrating an operation example of the overhead termination unit 25. The overhead termination unit 25 monitors whether or not an OTU frame is inputted (step S41), and keeps performing the monitoring operation in a case where there is no input (step S41: No). When there is an input of an OTU frame (step S41: Yes), the overhead termination unit 25 removes an overhead from the OTU frame (step S42), extracts information of a synchronous pattern from the overhead, and outputs the information of the synchronous pattern and the OTU frame from which the overhead has been removed (step S43). After executing step S43, the overhead termination unit 25 returns to step S41 and continues the process.

The demultiplexing unit 24a extracts information sequences #11, #12 and #13 from the OTU frame received from the overhead termination unit 25, and transfers the extracted information sequence #1n (n=1, 2, 3) to the frame synchronization unit $23a_n$ of the inverse conversion unit $20a_n$ along with the information of the synchronous pattern received from the overhead termination unit 25. The frame synchronization unit $23a_n$ of the inverse conversion unit $20a_n$ detects a frame head of the information sequence #1n using the information of the synchronous pattern received from the demultiplexing unit 24a. An operation of the frame synchronization unit $23a_n$ is similar to that of the frame synchronization unit $23_n$ of the first embodiment except for a point that information of a synchronous pattern received from the demultiplexing unit 24a is used in detection of the synchronous pattern in step S21 illustrated in FIG. 6.

In such a manner, in the signal transmission system of the present embodiment, the transmission device 1a scrambles data other than a code word indicating a frame head and replaces the code word indicating the frame head with a synchronous pattern for each information sequence, when decoding, multiplexing and transferring a plurality of 8B10B-coded information sequences. Also, a multiplexed signal, which has been acquired by multiplexing the information sequences, is additionally provided with information of a synchronous pattern and then transmitted. In the reception device 2a, the information of a synchronous pattern added to the multiplexed signal is used to determine a synchronous pattern inserted in each received information sequence and identify a frame head of each information sequence. By doing so, it is possible for the reception device 2a to identify a frame head of an information sequence without previous knowledge about a synchronous pattern, and an effect similar to that of the first embodiment can be achieved. Also, it is possible to arbitrarily change a synchronous pattern to be used.

Third Embodiment

In the second embodiment, the transmission side for an information sequence adds information of a fixed pattern to an OTU frame to perform transmission thereof, whereby the reception side is notified of the information of the fixed pattern inserted in the information sequence. However, in the present embodiment, the reception side is noticed of the information of the fixed pattern using a different method. A configuration of a signal transmission system according to the present embodiment is similar to that of the first embodiment.

In a transmission device 1 of the present embodiment, a multiplexing unit 14 stores information sequences #11, #12 and #13 received from the pattern adding units $13_n$ (n=1, 2, 3) in a data storage region of an OTU frame configured to have a fixed stuff region, and stores information of a fixed pattern in the fixed stuff region to perform transmission thereof.

In a reception device 2 of the present embodiment, a demultiplexing unit 24 extracts the information sequences #11, #12 and #13 from the received OTU frame and extracts the information of the fixed pattern from the fixed stuff region, and transfers the information sequence #1n (n=1, 2, 3) and the information of the fixed pattern to the frame synchronization unit $23_n$ of the inverse conversion unit $20_n$. The frame synchronization unit $23_n$ of the inverse conversion unit $20_n$ detects a frame head of the information sequence #1n by using the information of the synchronous pattern received from the demultiplexing unit 24.

In this way, in the signal transmission system of the present embodiment, the transmission device 1 scrambles data other than a code word indicating a frame head and replaces the code word indicating the frame head with a synchronous pattern for each information sequence when decoding, multiplexing and transferring a plurality of 8B10B-coded information sequences. Also, a multiplexed signal acquired by multiplexing information sequences is transmitted with information of a synchronous pattern being stored in a fixed stuff region thereof. In the reception device 2, information of a synchronous pattern included in the multiplexed signal is used to determine a synchronous pattern inserted in each received information sequence, and identify a frame head of each information sequence. Accordingly, it is possible for the reception device 2 to identify a frame head of an information sequence without previous knowledge about a synchronous pattern, and an effect similar to that of the first embodiment can be achieved. Also, it is possible to arbitrarily change a synchronous pattern to be used. Also, it is possible to notify a reception side of a synchronous pattern while suppressing an increase in the amount of transmitted data.

In each embodiment, there has been described a signal transmission system having a configuration in which a transmission device and a reception device are disposed at both ends of an optical transmission line and an information sequence is transmitted from the transmission device to the reception device. However, the signal transmission system may be configured to transmit an information sequence mutually between communication devices each of which includes both of a transmission device and a reception device. For example, the configuration may be modified to dispose communication devices provided with both of the transmission device and the reception device described in the first embodiment in both ends of the optical transmission line, and for the two communication devices to mutually transmit a signal.

Here, a hardware configuration to realize a transmission device 1 or 1a and a reception device 2 or 2a of each embodiment will be described. The 8B10B decoding unit $11_n$ of the transmission device 1 or 1a is realized by a decoder, and the scrambling unit $12_n$ is realized by a scrambler. The multiplexing unit 14 is realized by a multiplexer. In addition, the 8B10B coding unit $21_n$ of the reception device 2 or 2a is realized by a coder, and the descrambling unit $22_n$ is realized by a descrambler. The demultiplexing unit 24 or 24a is realized by a demultiplexer.

Figure 10:
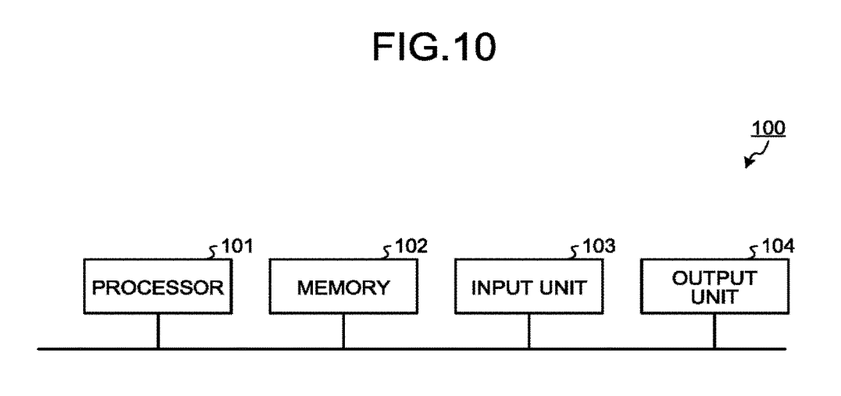
FIG. 10 is a diagram illustrating a configuration example of a processing circuit.

The pattern adding unit 13, of the transmission device 1 or 1a, the overhead generation unit 15 of the transmission device 1a, the frame synchronization unit $23_n$ of the reception device 2, and the frame synchronization unit $23a_n$ and the overhead termination unit 25 of the reception device 2a are realized by a processing circuit 100 illustrated in FIG. 10, that is, by a processor 101, a memory 102, an input unit 103 and an output unit 104. The processor 101 is a CPU (also referred to as central processing unit, central processing device, processing device, arithmetic device, microprocessor, microcomputer, processor, or DSP), a system LSI (large scale integration) circuit or the like. The memory 102 is a non-volatile or volatile semiconductor memory such as a RAM (random access memory), a ROM (read only memory), a flash memory, an EPROM (erasable programmable read only memory), or an EEPROM (electrically erasable programmable read-only memory), a magnetic disk, a flexible disk, an optical disk, a compact disc, a mini disc, a DVD (digital versatile disc), or the like.

The pattern adding unit $13_n$ of the transmission device 1 or 1a, the overhead generation unit 15 of the transmission device 1a, the frame synchronization unit $23_n$ of the reception device 2, and the frame synchronization unit $23a_n$ and the overhead termination unit 25 of the reception device 2a are realized by the processor 101 and a program stored in the memory 102. More specifically, the processor 101 reads out a program for an operation as each of these units from the memory 102 and executes the program, whereby the units are realized. The input unit 103 is an electronic circuit to receive a signal from a different processing circuit. For example, in a case where the processing circuit 100 is configured to make the pattern adding unit $13_n$, the input unit 103 receives a signal outputted from the scrambling unit $12_n$. The output unit 104 is an electronic circuit to transfer a signal to a different processing circuit. For example, in a case where the processing circuit 100 is configured to make the pattern adding unit $13_n$, the output unit 104 transfers a signal, in which a synchronous pattern has been inserted, to the multiplexing unit 14.

Note that the 8B10B decoding unit $11_n$, the scrambling unit $12_n$, the 8B10B coding unit $21_n$ and the descrambling unit $22_n$ may be realized by the processing circuit 100 illustrated in FIG. 10.

The configuration described in each of the above embodiments is intended to describe an example of contents of the present invention, and can also be combined with some different publicly-known technique, or can be partially omitted or modified without departing from the scope of the preset invention.

REFERENCE SIGNS LIST

1, 1a transmission device; 2, 2a reception device; 3 optical transmission line; $10_1$, $10_2$, $10_3$ conversion unit; $11_1$, $11_2$, $11_3$ 8B10B decoding unit; $12_1$, $12_2$, $12_3$ scrambling unit; $13_1$, $13_2$, $13_3$ pattern adding unit; 14 multiplexing unit; 15 overhead generation unit; $20_1$, $20_2$, $20_3$, $20a_1$, $20a_2$, $20a_3$ inverse conversion unit; $21_1$, $21_2$, $21_3$ 8B10B coding unit; $22_1$, $22_2$, $22_3$ descrambling unit; $23_1$, $23_2$, $23_3$, $23a_1$, $23a_2$, $23a_3$ frame synchronization unit; 24, 24a demultiplexing unit; 25 overhead termination unit.

The invention claimed is:

1. A transmission device multiplexing and transmitting a plurality of coded information sequences, comprising:
conversion units the number of which is identical to the number of the information sequences, to decode each of the information sequences, receive one of the information sequences after the decoding, scramble the received information sequence, and add a synchronous pattern indicating a head of a frame to the scrambled information sequence to perform output thereof; and
a multiplexing unit to multiplex the information sequence outputted from each of the conversion units.

2. The transmission device according to claim 1, further comprising an overhead generation unit to add an overhead including a fixed bit pattern that is the synchronous pattern, to a multiplexed signal outputted from the multiplexing unit.

3. The transmission device according to claim 1, wherein the multiplexing unit generates a multiplexed signal by storing the information sequence outputted from each of the conversion units in a payload of a frame having a fixed stuff region and storing a fixed bit pattern that is the synchronous pattern in the fixed stuff region.

4. The transmission device according to claim 1, wherein the information sequence is an 8B10B-coded information sequence.

5. The transmission device according to claim 1, wherein the information sequence is a common public radio interface signal.

6. A communication device comprising the transmission device according to claim 1.

7. A signal transmission system having a transmission device and a reception device, and multiplexing and transmitting a plurality of coded information sequences, wherein the transmission device includes:
conversion units the number of which is identical to the number of the information sequences, to decode each of the information sequences, receive one of the information sequences after the decoding, scramble the received information sequence, and add a synchronous pattern indicating a head of a frame to the scrambled information sequence to perform output thereof, and
a multiplexing unit to generate a multiplexed signal by multiplexing the information sequence outputted from each of the conversion units and transmit the generated multiplexed signal to the reception device, and
the reception device includes:
a demultiplexing unit to receive the multiplexed signal, and demultiplex the signal into the information sequences before the multiplex of the multiplexing unit to perform output thereof; and
inverse conversion units the number of which is identical to the number of the information sequences outputted from the demultiplexing unit, to receive one of the information sequences outputted from the demultiplexing unit, perform frame synchronization processing for detecting the head of the frame based on the synchronous pattern, and descrambling and coding, with respect to the received information sequence.

8. The signal transmission system according to claim 7, wherein the transmission device further comprises an overhead generation unit to add an overhead including a fixed bit pattern that is the synchronous pattern, to the multiplexed signal outputted from the multiplexing unit,
the demultiplexing unit notifies each of the inverse conversion units of the fixed bit pattern added to the received multiplexed signal, and
each of the inverse conversion units performs the frame synchronization processing based on the fixed bit pattern given by the notification from the demultiplexing unit.

9. The signal transmission system according to claim 7, wherein the multiplexing unit generates the multiplexed signal by storing the information sequence outputted from each of the conversion units in a payload of a frame having a fixed stuff region and storing a fixed bit pattern that is the synchronous pattern in the fixed stuff region,
the demultiplexing unit notifies each of the inverse conversion units of the fixed bit pattern stored in the fixed stuff region of the received multiplexed signal, and
each of the inverse conversion units performs the frame synchronization processing based on the fixed bit pattern given by the notification from the demultiplexing unit.

10. The signal transmission system according to claim 7, wherein the information sequence is an 8B10B-coded information sequence, and coding performed by the inverse conversion units is 8B10B-coding.

11. The signal transmission system according to claim 7, wherein the information sequence is a common public radio interface signal, and coding performed by the inverse conversion units is 8B10B-coding.

* * * * *